United States Patent
Xia

(10) Patent No.: US 6,203,623 B1
(45) Date of Patent: Mar. 20, 2001

(54) AEROSOL ASSISTED CHEMICAL CLEANING METHOD

(75) Inventor: Chang Feng Xia, Plano, TX (US)

(73) Assignee: Ball Semiconductor, Inc., Allen, TX (US)

( * ) Notice: Subject to any disclaimer, the term of this patent is extended or adjusted under 35 U.S.C. 154(b) by 0 days.

(21) Appl. No.: 09/473,818

(22) Filed: Dec. 28, 1999

(51) Int. Cl.[7] ............................................... B08B 9/08
(52) U.S. Cl. .................. 134/1; 134/2; 134/3; 134/6; 134/7; 134/8; 134/11; 134/22.1; 134/22.11; 134/22.18; 134/34; 134/36; 134/38; 134/39; 134/40; 134/41; 134/42; 134/102.2; 134/169 R; 451/38; 451/39; 451/40
(58) Field of Search ................................... 134/1, 2, 3, 6, 134/7, 8, 11, 22.1, 22.11, 22.18, 34, 36, 38, 39, 40, 41, 42, 102.2, 169 R; 451/38, 39, 40

(56) References Cited

U.S. PATENT DOCUMENTS

| | | | |
|---|---|---|---|
| 3,297,481 | * | 1/1967 | Newman et al. ....................... 134/22 |
| 3,833,417 | * | 9/1974 | Griperis ............................... 134/22 C |
| 5,062,898 | * | 11/1991 | McDermott et al. ...................... 134/7 |
| 5,108,512 | * | 4/1992 | Gofnett et al. ........................... 134/7 |
| 5,145,113 | * | 9/1992 | Burwell et al. .................... 239/102.2 |
| 5,186,192 | * | 2/1993 | Netsu et al. ............................ 134/68 |
| 5,377,911 | * | 1/1995 | Bauer et al. .......................... 239/135 |
| 5,462,639 | | 10/1995 | Matthews et al. ................. 156/662.1 |
| 5,711,819 | * | 1/1998 | Miyasaki ............................... 134/11 |
| 5,846,338 | * | 12/1998 | Borova et al. .......................... 734/11 |
| 5,931,721 | * | 8/1999 | Rose et al. .............................. 451/89 |

FOREIGN PATENT DOCUMENTS 2-119241   10/1988   (JP) .

* cited by examiner

Primary Examiner—S. Carrillo
(74) Attorney, Agent, or Firm—Haynes and Boone, LLP

(57) ABSTRACT

An aerosol assisted chemical cleaning method to remove wall deposition from reaction chambers is provided. The method generates cleaning chemicals in an aerosol state, and then feeds them into the reaction chamber by a carrier gas. The cleaning chemicals interact quickly with unwanted deposits on all internal surfaces of the reaction chamber. By controlling the pressure in the closed reaction chamber, the deposits can be stripped off from the wall and fall into a waste acid collector. The acid collector can then process the waste to prevent contamination.

7 Claims, 1 Drawing Sheet

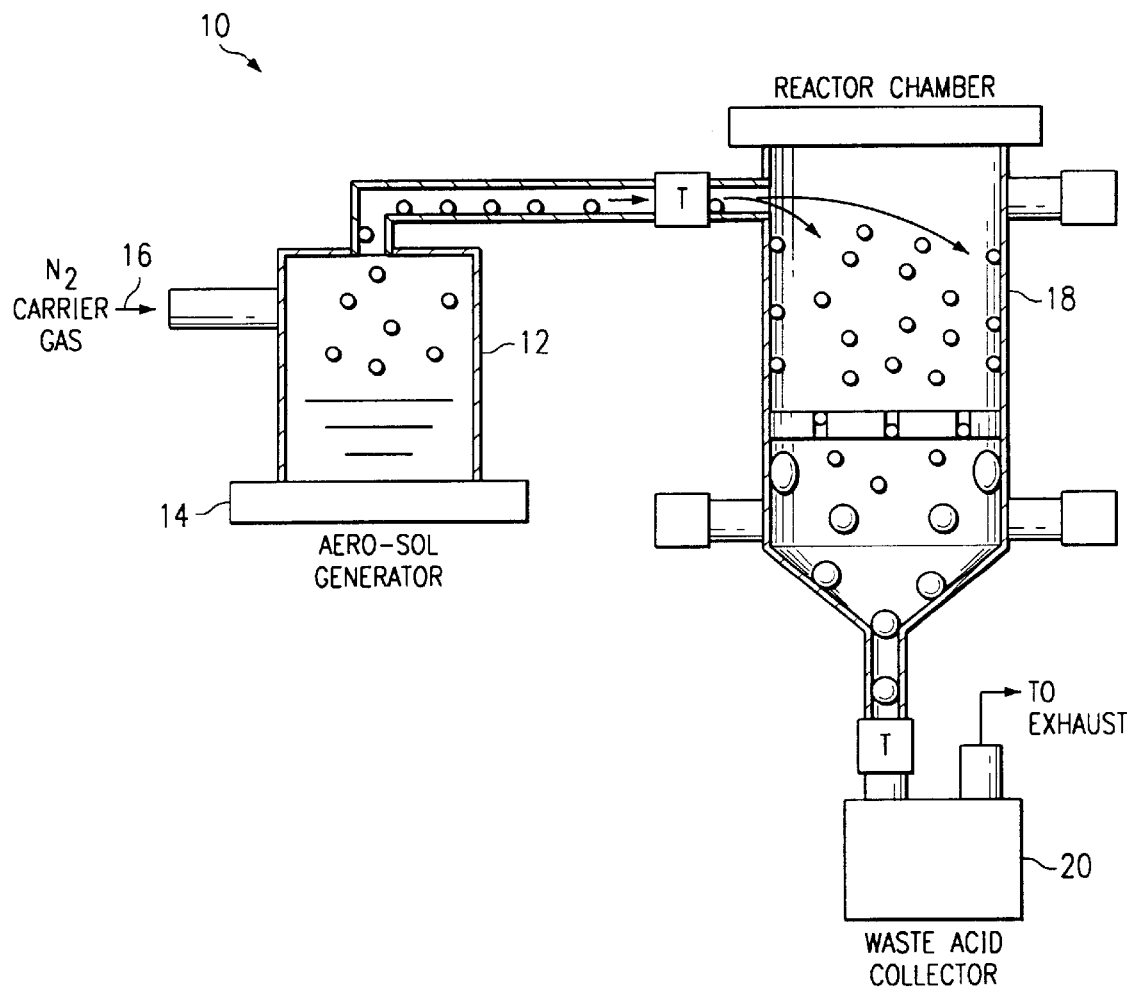

AEROSOL ASSISTED CHEMICAL CLEANING METHOD

BACKGROUND OF THE INVENTION

The present invention relates generally to semiconductor processing procedures, and more particularly, to a method for cleaning a reactor chamber used in semiconductor manufacturing flow.

It is inevitable to use many types of chemicals in the semiconductor processing procedures. In such procedures, many reaction chambers are used where the chemicals are applied and reacted on the semiconductor. One major problem affecting the quality of the processed material is the unwanted deposition of chemicals on the walls of the reaction chamber ("wall deposition"). During processing, chemicals accumulate and deposit on the wall of a reaction chamber, and thus contaminate a strictly clean chemical reaction environment which is almost always required by various procedures. These deposited materials, such as silicon, oxides, nitride, copper, or aluminum, are extremely detrimental to the processing procedures since the deposited material can form particles to be dropped onto the semiconductor materials that are under active chemical reactions. It is well known that these particles are "killers" of finished semiconductor devices. Thus it is necessary to clean the reaction chamber periodically so that no significant amount of wall deposition can accumulate.

Traditionally, two major methods are used to clean the reaction chamber. A wet cleaning method requires the reaction chamber to be completely removed from its fixture and sunk into an appropriate chemical solution for several hours to strip off any build-up of the wall deposition. Although this procedure is effective in maintaining a clean reaction chamber, it is cumbersome for various reasons. For one, the reaction chamber, which may be made of a delicate material such as quartz, has to be removed and handled carefully. Moreover, the reaction chambers usually have to be cooled down from their reaction temperature, which requires an additional waiting period. Further, a large quantity of the cleaning chemicals needs to be used since the reaction chamber has to be immersed into these chemicals. Further still, once the chamber is cleaned, it has to be reassembled.

The other method to clean the reaction chamber is plasma dry etching. Plasma dry etching is advantageous because it does not require the chamber to be cooled, disassembled, removed, and immersed into a chemical solution sink. However, due to the nature of dry etching, it does not clean the reaction chamber as effectively as the wet cleaning method. The reliability of the plasma dry etching method is a significant concern.

An improved method is needed for cleaning the reaction chamber for semiconductor processing procedures. The improved method should be effective and reliable like traditional wet cleaning methods, and simple to implement like the traditional plasma dry etching methods.

SUMMARY OF THE INVENTION

An improved aerosol assisted chemical cleaning method to remove wall deposition from reaction chambers is provided. In one embodiment, the method generates cleaning chemicals in an aerosol state, and then feeds them into the reaction chamber by a carrier gas. The cleaning chemicals interact quickly with unwanted deposits on all internal surfaces of the reaction chamber. By controlling the pressure in the closed reaction chamber, the deposits can be stripped off from the wall and fall into a waste acid collector. The acid collector can then process the waste to prevent contamination.

One advantage of the present invention is that it does not require the disassembly and/or removal of the reaction chamber from its fixtures.

Another advantage of the present invention is that it can start cleaning without waiting for the reaction chamber to cool down.

Yet another advantage of the present invention is that it consumes relatively small amounts of cleaning chemicals.

Still another advantage of the present invention is that it is quicker than the traditional cleaning methods.

BRIEF DESCRIPTION OF THE DRAWINGS

The FIGURE illustrates a system schematic of an aerosol assisted chemical cleaning system according to one embodiment of the present invention.

DESCRIPTION OF THE PREFERRED EMBODIMENT

For illustration purpose, a Chemical Vapor Deposition (CVD) chamber is used as an example. It is understood that any reaction chamber that is similar to the CVD chamber can use the following method to clean undesired wall depositions.

Referring to the FIGURE, the reference numeral 10 represents, in general, an aerosol assisted chemical cleaning system 10. The cleaning system 10 will be shown, for illustration purpose, working with a Chemical Vapor Deposition (CVD) chamber. It is understood that any reaction chamber that is similar to the CVD chamber can use the following method to clean undesired wall depositions.

A cleaning chemical reserve 12 stores an appropriate amount of a cleaning chemical. The cleaning chemicals are generally acids such as HF, HCL, or $H_3PO_4$, depending on the elements of the wall deposition inside a reaction chamber. The cleaning chemical reserve 12 is seated on an aerosol generator 14, which can be a commercially available ultrasonic mist generator. When the cleaning chemical is excited into an aerosol state, it is carried into a pipe by a carrier gas 16. The carrier gas can be any inent gas such as nitrogen, argon, etc. The carrier gas 16, along with the cleaning chemical, is fed into a reaction chamber 18 through an existing valve situated at the upper part of the chamber 18. All other input or output gas valves are sealed for the cleaning process. When a sufficient amount of cleaning chemical has been delivered into the chamber 18, the cleaning chemical in the aerosol state saturates the chamber. Just like chemicals in a vapor state, the cleaning chemical contacts the internal surface of the reaction chamber 18 and immediately acts upon a targeted chemical deposit thereon. Since the aerosol state of the cleaning gas is "thicker" than a chemical vapor, it reacts quickly with the chemicals deposited on the wall of the chamber 18.

Once the reaction happens, the resultants are usually in liquid state, and thus wall deposits can be rapidly torn off the wall. By controlling the pressure of the reaction chamber, the cleaning chemicals will be pushed towards the bottom of the chamber 18, along with the liquid resultant from the reactions. A waste acid collector 20 can be positioned at an exit located at the bottom of the chamber 18 to collect the waste and thereby prevent contamination. Cold trap or alkaline absorbent can also be used to process the waste for better results.

One advantage of the present invention is that there is no need to dissemble and remove the reaction chamber from its fixtures. All existing fixtures and even gas valves can be retained in their normal, operational arrangement.

Another advantage of the present invention is that the cleaning process can start immediately after the cleaning chemical is fed into the chamber, without waiting for the chamber to cool down from its normal operation temperature. In fact, a heated environment helps speed up chemical reactions between the cleaning chemical and the wall deposits.

Yet another advantage of the present invention is that the cleaning process consumes relatively small amounts of cleaning chemicals, and the cleaning process itself takes far shorter time than the traditional cleaning methods. For a CVD reaction chamber, it is estimated that less than 100 ml of acids is needed for one round of cleaning and it takes only minutes to complete the process.

The above disclosure provides many different embodiments, or examples, for implementing different features of the invention. Techniques and requirements that are only specific to certain embodiments may be imported into other embodiments. Also, specific examples of components, and processes are described to help clarify the invention. These are, of course, merely examples and are not intended to limit the invention from that described in the claims.

While the invention has been particularly shown and described with reference to the preferred embodiment thereof, it will be understood by those skilled in the art that various changes in form and detail may be made therein without departing from the spirit and scope of the invention, as set forth in the following claims.

What is claimed is:

1. A method for cleaning a chemical reaction chamber that attracts wall deposition during a semiconductor processing procedure, the method comprising the steps of:

providing a chemical reaction chamber used for semiconductor processing, the chemical reaction chamber having an input and output means and wherein chemical deposits are present on walls of the chemical reaction chamber;

providing an acidic cleaning chemical selected from the a group consisting of HF, HCl and $H_3PO_4$;

transforming said acidic cleaning chemical into an aerosol state;

feeding the aerosol of said acidic cleaning chemical into the chemical reaction chamber by a carrier gas through said input means of the chemical reaction chamber; and causing a reaction between said aerosol of said acidic cleaning chemical and the chemical deposits present on said walls, such that said chemical deposits are stripped off of said walls of the chemical reaction chamber.

2. The method of claim 1 wherein the step of transforming further includes the step of using an ultrasonic mist generator to convert the acidic cleaning chemical into the aerosol state.

3. The method of claim 1 wherein the carrier gas is an inert gas.

4. The method of claim 1 further comprising:

pressurizing the chemical reaction chamber to facilitate the reaction of the aerosol of said acidic cleaning chemical with the chemical deposits on said walls of said chemical reaction chamber.

5. The method of claim 1 further comprising:

providing a waste acid collector in communication with said output means of the chemical reaction chamber for processing wastes resulting from the reaction between the aerosol of said acidic cleaning chemical and the chemical deposits on said walls of said chemical reaction chamber.

6. The method of claim 1 wherein less than 100 ml of the acidic cleaning chemical is needed for cleaning the chemical reaction chamber.

7. The method of claim 1 wherein each of said input and output means of the chemical reaction chamber includes a gas valve.

* * * * *

UNITED STATES PATENT AND TRADEMARK OFFICE
CERTIFICATE OF CORRECTION

PATENT NO. : 6,203,623 B1
DATED : March 20, 2001
INVENTOR(S) : Chang Feng Xia

It is certified that error appears in the above-identified patent and that said Letters Patent is hereby corrected as shown below:

Column 4,
Line 1, "the a" should be -- the --.

Signed and Sealed this

Fourteenth Day of August, 2001

*Attest:*

*Attesting Officer*

NICHOLAS P. GODICI
*Acting Director of the United States Patent and Trademark Office*